United States Patent
Tverdy et al.

[11] Patent Number: 5,903,163
[45] Date of Patent: May 11, 1999

[54] APPARATUS AND METHOD OF CONTROLLING THE ENVIRONMENTAL TEMPERATURE NEAR SEMICONDUCTOR DEVICES UNDER TEST

[75] Inventors: Mark A. Tverdy; Leland R. Nevill, both of Boise, Id.

[73] Assignee: Micron Technology, Inc., Boise, Id.

[21] Appl. No.: 08/773,019

[22] Filed: Dec. 24, 1996

[51] Int. Cl.$^6$ .................................................. G01R 31/26
[52] U.S. Cl. ............................................................. 324/760
[58] Field of Search .................................. 324/760, 500, 324/765, 555

[56] References Cited

U.S. PATENT DOCUMENTS

| | | | |
|---|---|---|---|
| 4,881,591 | 11/1989 | Rignall | 324/760 X |
| 4,967,155 | 10/1990 | Magnuson | 324/760 X |
| 5,582,235 | 12/1996 | Hamilton et al. | 324/760 X |

*Primary Examiner*—Michael Brock
*Attorney, Agent, or Firm*—Kirkpatrick & Lockhart LLP

[57] ABSTRACT

An apparatus and method for controlling the environmental conditions surrounding an integrated circuit device during performance testing is disclosed. The apparatus includes a housing having an inlet and outlet, a test assembly having a plurality of device test sites, a heat transfer medium source connected to the inlet, a negative pressure source connected to the outlet to promote flow of the heat transfer medium from the inlet to the outlet, and at least one flow resistance member positioned between the test sites and the outlet to control the flow of the heat transfer medium proximate to the test sites. In a preferred embodiment the flow resistance member is integral with the test assembly and the test sites have at least one flow path through each of the test sites serving as the flow resistance member and sized to provide for a uniform flow field in the vicinity of the test sites. In the practice of the invention, the resistance member is positioned such that upon the application of a negative pressure on the outlet of the housing a uniform flow and pressure field develops in the vicinity of the test sites and devices.

21 Claims, 7 Drawing Sheets

APPARATUS AND METHOD OF CONTROLLING THE ENVIRONMENTAL TEMPERATURE NEAR SEMICONDUCTOR DEVICES UNDER TEST

BACKGROUND OF THE INVENTION

1. Field of the Invention

The present invention generally relates to controlling the environmental conditions surrounding a device. More particularly, the present invention relates to a method and apparatus for providing a uniform air flow and temperature near a plurality of semiconductor devices during performance testing.

2. Description of the Invention Background

An integrated circuit is a solid state device in which electrical components and electrical connections between the components are incorporated into a solid matrix by the strategic placement of various conducting, semiconducting and insulating materials to form and encapsulate the desired circuit in the composite solid matrix. The development of the integrated circuit has led to the miniaturization of electronics by providing a strong matrix to support and protect fragile miniaturized components and connections and facilitating the placement of the electrical components in close proximity. The integrated circuit has also served to increase the reliability of electronic devices by the elimination of moving parts and fragile wiring and electrical connections.

Integrated circuits are typically constructed by depositing a series of individual layers of predetermined materials on a wafer shaped semiconductor substrate, or "wafer". The individual layers of the integrated circuit are, in turn, produced by a series of manufacturing steps. The precise characteristics of the layers, such as composition, thickness, surface quality, uniquely determine the electronic properties and the performance of the integrated circuit. Testing of the integrated circuits is performed throughout the manufacturing process in order to ensure that the circuits perform within the design specifications and to serve as a quality control indicator for the preceding manufacturing steps.

In addition to the short-term performance testing described above, longer term performance tests are run to provide life estimations and compensation factors for performance variations. The conditions used in performance testing generally vary from normal operation to extreme condition testing typically ranging from −50° C. to 150° C. Extreme condition testing, such as burn-in testing, is used to identify seriously defective conditions in the circuit that would lead to early lifetime failures, while long-term normal operation testing is directed to identifying systemic problems in the circuit.

It is desirable to perform the testing of the circuits in a manufacturing process time scale to prevent the testing from forming a bottleneck in the manufacturing process and to quickly identify changes in the manufacturing process. Therefore, the integrated circuit devices are generally tested in bulk quantities of 8 to 64 devices at a time depending upon the particular test. However, the bulk testing of the devices causes problems with maintaining uniform environmental test conditions near each device, which can lead to erroneous test results. Because the test results are used not only to provide an indication of the quality of the individual device, but to form a statistical sampling for the determination of process control conditions, erroneous test results can have a substantial impact on the cost effectiveness and the quality of the manufacturing process. Generally, the bulk device performance test procedures are considered to be reliable and the testing in control if the temperature variation of the devices is within ±4° C.

The variation in the environmental conditions near the devices under test (DUTs) is important because the performance and failure of the device is a strong function of the device temperature.

The testing of the devices is normally performed within a test apparatus having a contained environment to allow the test conditions to be varied depending upon the particular performance test being run. However, the devices under test will generate heat due to resistive losses that may not be freely transferred away from the device resulting in an increased local environmental temperatures and operating temperatures of the devices under test. This type of variation can be quantified to some extent and has been compensated for in the prior art through the use of weighting factors. A second type of variation occurs as a result of nonuniform air flow patterns within the apparatus that produce device to device variations in the amount of heat transfer from the device to the environment resulting in device to device temperature and performance variations. The second type of variation is not as easily quantifiable, if at all, due to the contributing factors of nonuniform air flow, nonuniform environmental temperatures and actual variations in the performance of devices. It is, therefore, very difficult to assess the variations in performance due to the manufacturing process or to determine the precise performance rating for the device in the bulk testing apparatuses of the prior art. While specific data can be obtained by performing individual testing of the devices, individual device test methods are not sufficiently rapid to allow more than a small sampling of the devices to be made without introducing a severe bottleneck into the manufacturing process.

One attempt to provide an integrated circuit device performance test apparatus that addresses the device to device variation is provided by U.S. Pat. No. 5,359,285 to Hashinaga et al. The Hashinaga patent requires that the integrated circuit to be tested contain a temperature sensing device that is used in conjunction with the apparatus. The apparatus includes a control device that is connected to the temperature sensing device and an air flow and direction controller. The control device is connected through a temperature detection device to the individual devices and the temperatures of the individual devices are monitored by the control device. In response to the temperature data, the control device adjusts the direction and flow rate of the air in the apparatus through a series of ports. The feedback loop operates to maintain the temperature of the devices under test within a prescribed temperature range.

A number of practical problems are encountered when using the apparatus of the Hashinaga patent. While, the incorporation of a temperature sensor into the chip provides a more precise way to determine the temperature of the actual device, it may not be practical, desirable or cost effective to incorporate a temperature sensor into each device. The embodiments disclosed in the Hashinaga patent also envision a limited number of directional air flow nozzles servicing a large number of devices, which appears to present control problems considering that the control device will be monitoring all of the devices to control the direction of the air flow. Also, in order to service a number of devices the air flow must be directed substantially parallel to the devices under test which will result in different devices experiencing different air flow patterns and temperatures. The aforementioned problems can be somewhat overcome, for instance, by providing an individual air flow nozzle for each device under test. This results in a very complex and cost ineffective system requiring experienced oversight at all times and an extensive requalification of the baffling used to control the air flow every time the system is taken down for repairs or preventive maintenance. Even if these problems can be addressed satisfactorily, a basic problem remains in the system. The Hashinaga patent attempts to provide a method and apparatus that allows for the performance testing of the devices at a prescribed temperature attributing all of the variation in the device temperature to the variations in the apparatus. However, a portion of the device to device variation observed is actually attributable to variations in the manufacture of the device, which provides important data on quality control of the manufacturing process in addition to the performance of the individual device.

Thus, it is apparent that a need exists for an improved integrated circuit device performance testing apparatus which overcomes, among others, the above-discussed problems so as to provide more reliable data on the performance of the individual devices and manufacturing process in a cost effective and reliable manner.

SUMMARY OF THE INVENTION

The above objects and others are accomplished by an apparatus and method in accordance with the present invention. The apparatus includes a housing having an inlet and outlet, a test assembly having a plurality of device test sites disposed within the housing between the inlet and outlet, a heat transfer medium source connected to the inlet, a negative pressure source connected to the outlet to promote flow of the heat transfer medium from the inlet to the outlet, and at least one flow resistance member positioned to control the flow of the heat transfer medium proximate to the test sites. In a preferred embodiment, the test assembly includes a test tray containing the plurality of test sites and which is seated on a platen and a load board containing a plurality of test sockets corresponding to the test sites and which can be brought into electrical contact with integrated circuit devices placed in the test sites. Preferably, the test tray and the platen form the flow resistance member and each test site contains at least one flow path through the test tray and the platen to provide for a uniform flow field in the vicinity of the test sites. In the practice of the invention, the flow resistance member is positioned such that upon the application of a negative pressure on the outlet of the housing a uniform flow and pressure field develops in the vicinity of the test sites. Integrated circuit devices are then placed into the test sites and electrical contact is established between the individual devices in the test sites and the corresponding test sockets and testing is performed, while a negative pressure is applied to control the flow of air over the devices under test.

Accordingly, the present invention provides an effective solution to problems associated with device to device variations in bulk performance testing so as to provide more reliable data on the performance of the individual devices and manufacturing process in a cost effective and reliable manner. These and other details, objects, and advantages of the invention will become apparent as the following detailed description of the present preferred embodiment thereof proceeds.

BRIEF DESCRIPTION OF THE DRAWINGS

The preferred embodiment of the present invention will be described in greater detail with reference to the accompanying drawings, wherein like members bear like reference numerals and wherein.

DETAILED DESCRIPTION OF THE PREFERRED EMBODIMENTS

Figure 1:
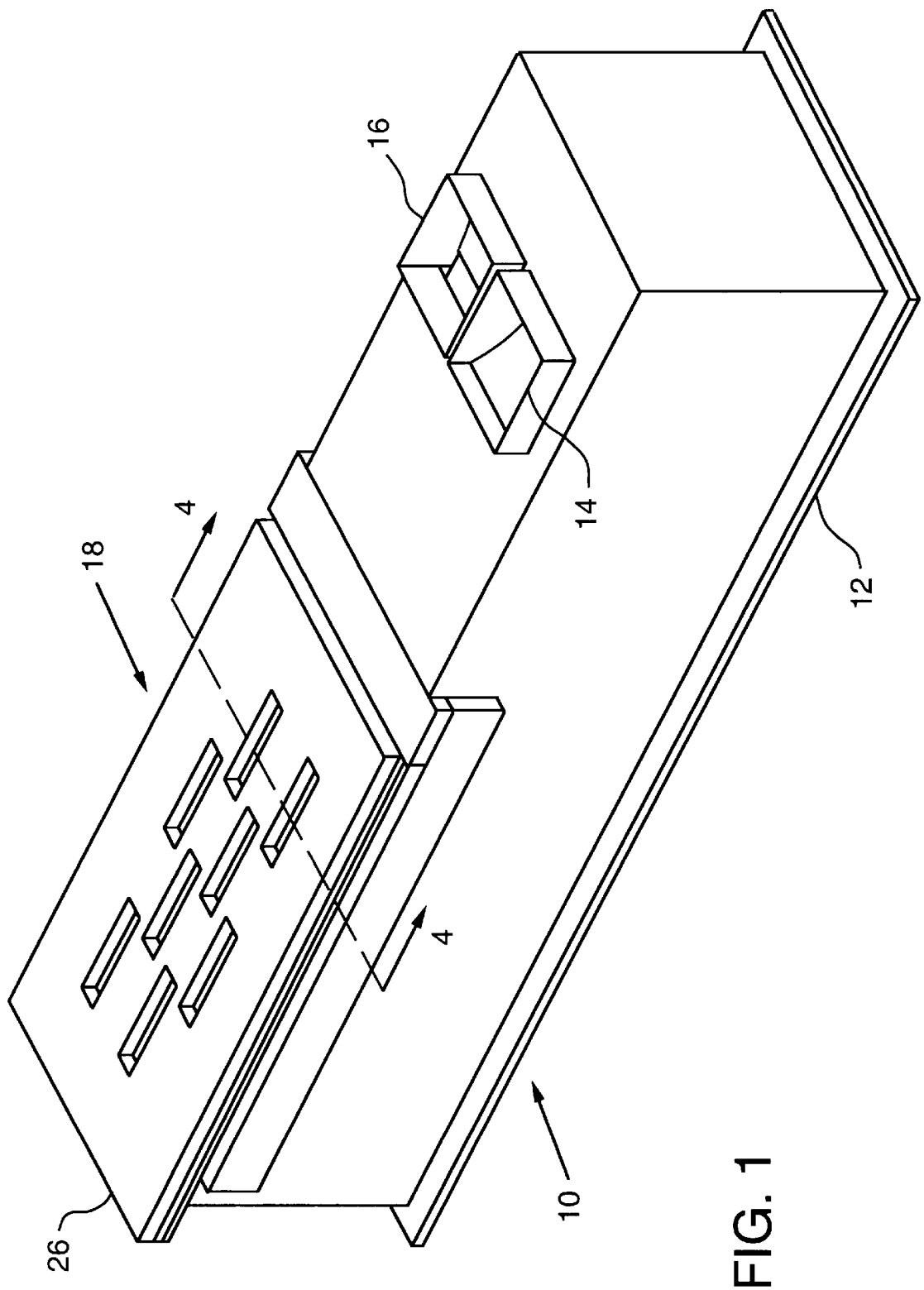
FIG. 1 is a perspective view of the integrated circuit test apparatus of the present invention.
Figure 2:
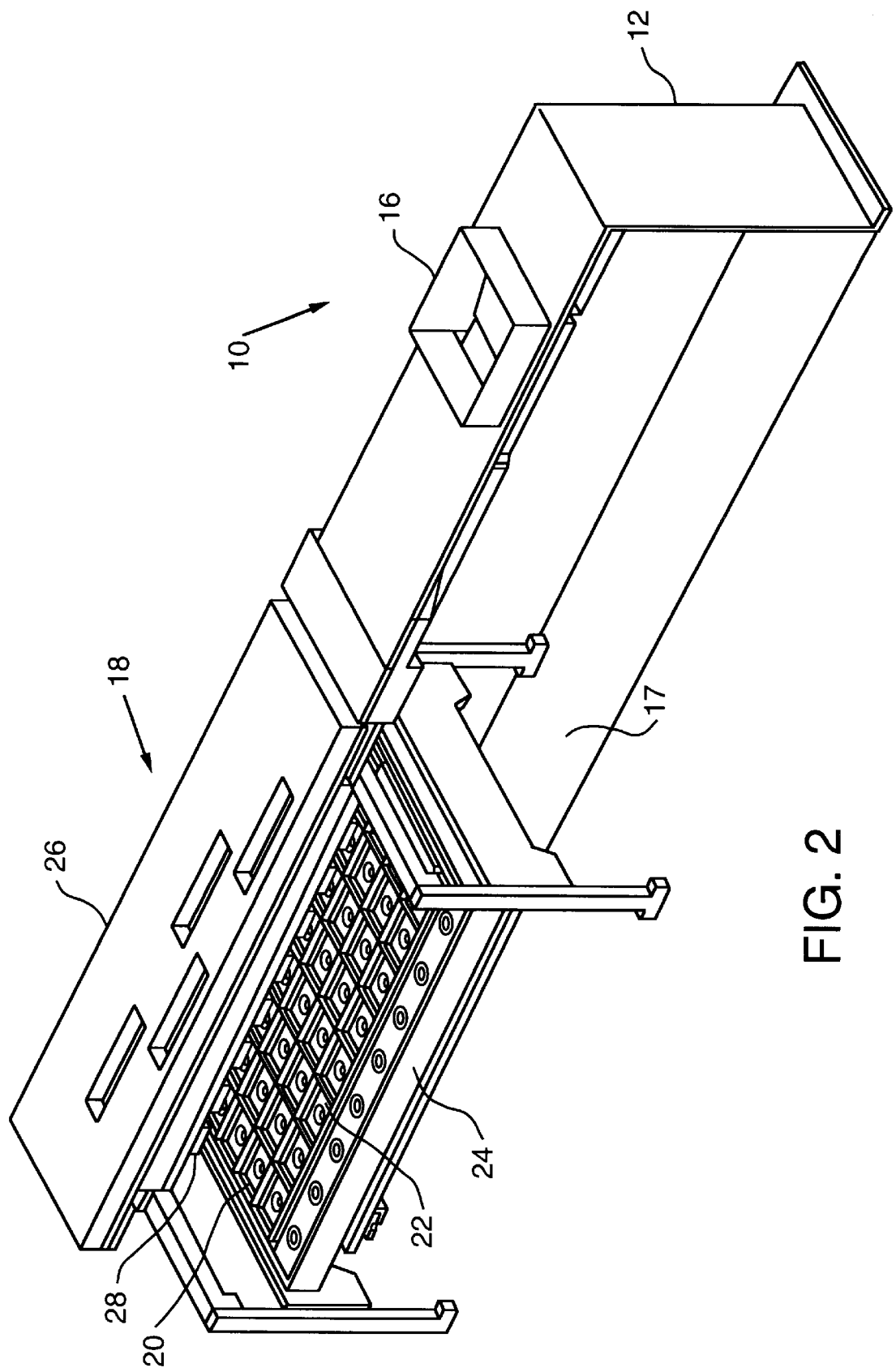
FIG. 2 is a cut away perspective view of the apparatus of the present invention.

The operation of the apparatus 10 will be described generally with reference to the drawings for the purpose of illustrating present preferred embodiments of the invention only and not for purposes of limiting the same. The apparatus 10 of the present invention provides for a uniform heat transfer capability for a plurality of integrated circuit devices 11 during performance testing to allow simultaneous testing of the devices under substantially uniform conditions.

The apparatus 10 includes a housing 12 having an inlet 14, an outlet 16, and a test assembly 18 connected externally to a test system (not shown) to provide power and input/output signals for testing the devices 11. The test assembly 18 includes a test tray 20 having a plurality of partitioned test sites 22 for holding the integrated circuit devices 11. The test tray 20 is seated on a platen 24 within the housing 12 and a load board 26 is connected to the external test system and has a plurality of test sockets 28 corresponding to the test sites 22, as is known in the art. The test sockets 28 are aligned so that the sockets 28 can be brought into electrical contact with integrated circuit devices 11 that are placed in the test sites 22. The positioning of the test tray 20 within the housing 12 defines an inlet plenum 15 between the test tray 20 and the inlet 14 and an outlet plenum 17 between the test tray 20 and the outlet 16. Heat transfer media, preferably air, is circulated through the housing 12 to control the temperature of the devices 11 during testing. It will be appreciated that the particular heat transfer media used in the apparatus 10 can be varied depending upon the heat transfer requirements for the test conditions of interest and the in-service operating conditions for the devices 11. One skilled in the art will further appreciate that the materials of construction of the apparatus of the present invention can be suitably chosen to accommodate the desired range of testing conditions.

Figure 3:
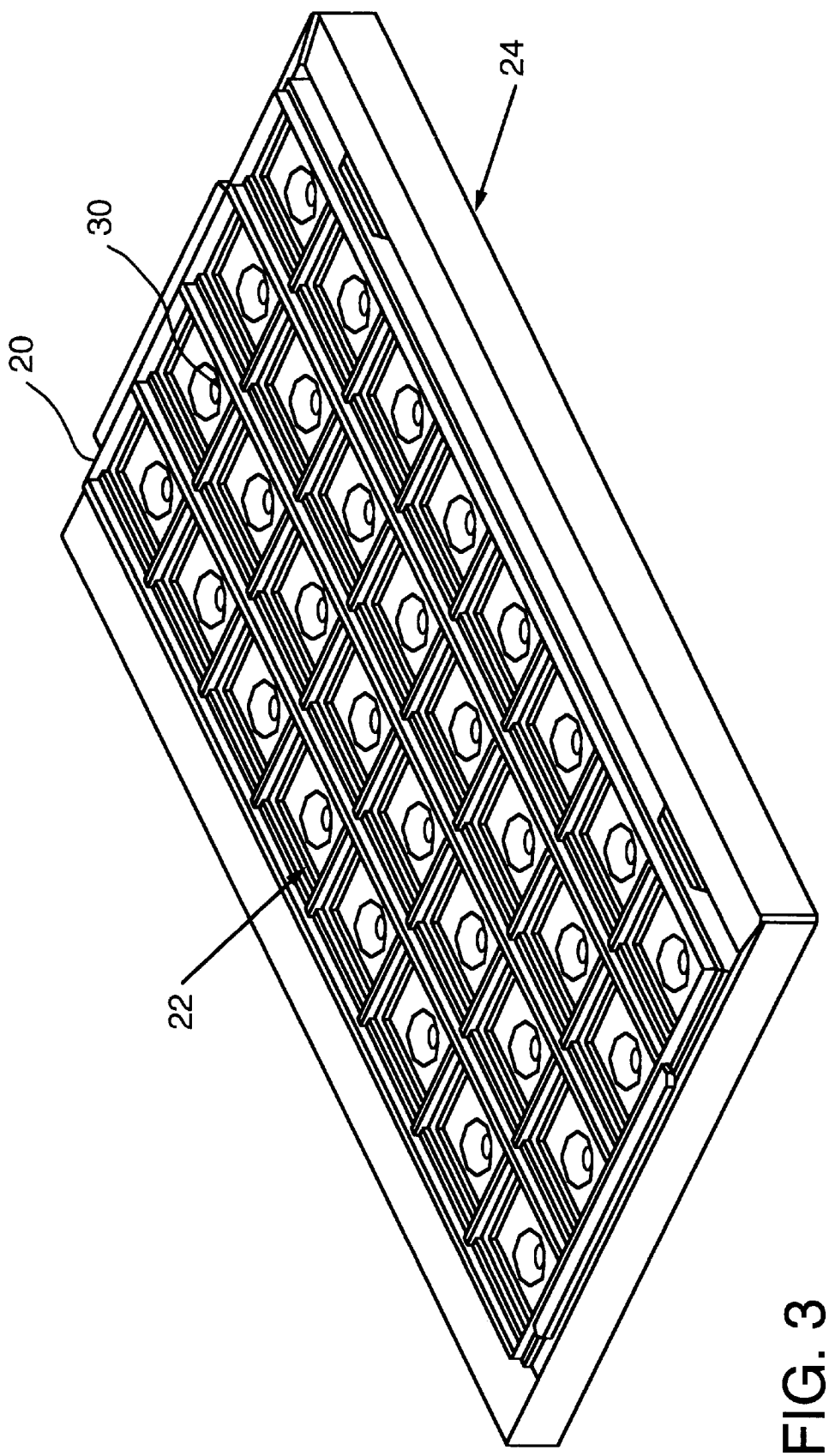
FIG. 3 is a perspective view of a preferred embodiment of the test tray and platen of the present invention.
Figure 4:
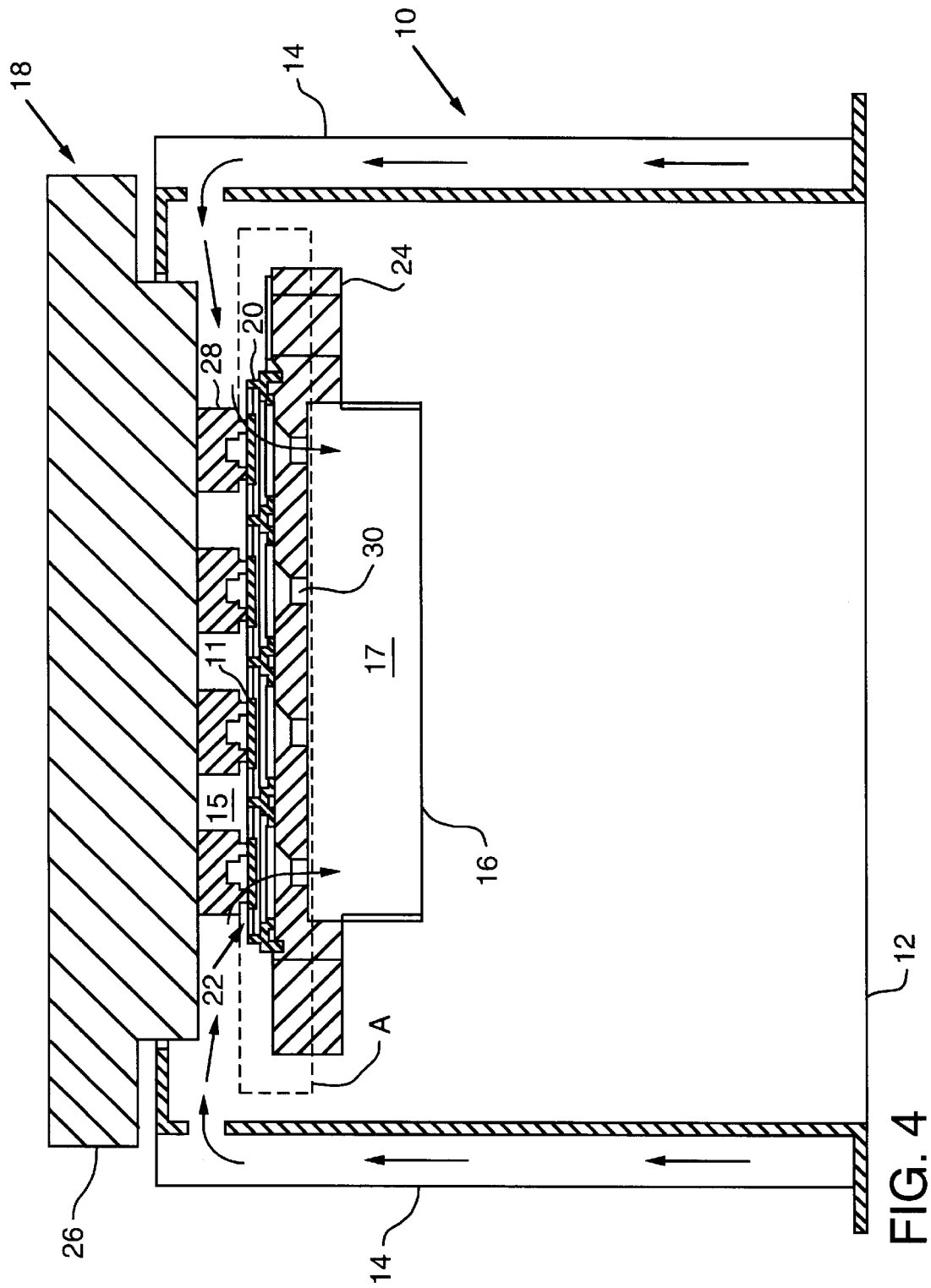
FIG. 4 is a cross sectional view of a preferred embodiment of the housing and test assembly of the present invention taken along line 3—3 on FIG. 1 and schematically depicting the flow patterns of the heat transfer media.
Figure 5:
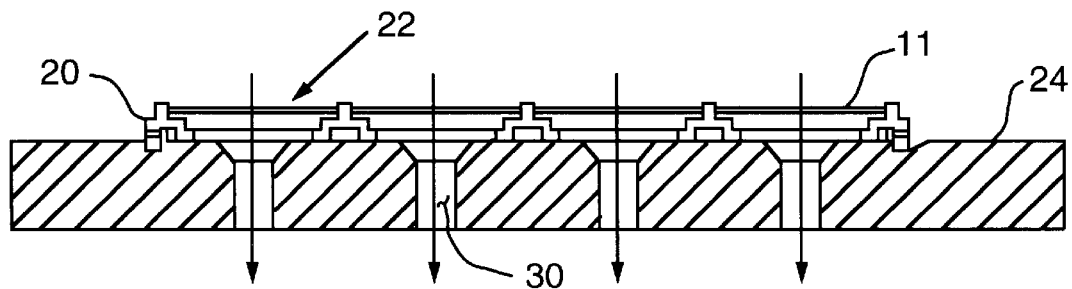
FIG. 5 is a enlarged view of portion A of FIG. 4 schematically showing the flow pattern of the heat transfer media through the test tray and the platen.

In a preferred embodiment, the test tray 20 and the platen 24 act as integral flow resistance members for controlling the flow pattern of the heat transfer media in the vicinity of the test sites 22. Preferably, each test site 22 contains at least one flow path 30 extending through the test tray 20 and the platen 24 providing fluid communication from the inlet plenum 15 to the outlet plenum 17, as shown in FIGS. 3–5. The test sites 22 are sized to allow the flow of the heat transfer media around the devices 11 when the devices 11 are seated in the test sites 22. It is also preferred that the flow paths 30 are uniformly sized and distributed in the test sites 22 to provide for a uniform flow of the heat transfer medium over the surface of the devices 11. In addition, the flow paths 30 are sized to provide a sufficient flow resistance across the test tray 20 so that an application of a negative pressure to the outlet 16 of the housing 12 will result in substantially uniform flow of the heat transfer medium around the devices 11 and through each of the flow paths 30 in the individual test sites 22 and a uniform pressure field and gradient near the test sites 22.

In a current preferred embodiment, the platen 24 is fixed in the housing 12 to ensure proper contact between the test sockets 28 and the devices 11 in the test tray 20. The test tray 20 is removably seated in the platen 24 to allow the devices to be easily inserted and removed from the housing 12. However, it will be appreciated that the test tray 20 and platen 24 can be an integral fixed or removable component in the housing 12. In addition, the load board 26 can also be integral with the test tray 20, which can then be connected to the external test system through the housing 12. In this manner, physical obstructions (i.e. the load board 26 and test sockets 28) that can result in a nonuniform flow distributions near the devices 11 can be minimized.

Also, the flow resistance member does not have to be integral with the test tray 20 and/or the platen 24, but can be separately placed anywhere within the housing 12 to provide for a controllable flow and pressure field in the vicinity of the test sites 22. It is understood that the flow and pressure field does not necessarily have to be uniform, only controlled, depending upon the particular test conditions of interest. In some instances, it may be desirable to perform testing using a predetermined nonuniform pattern of resistances that provide for a nonuniform flow field. In preferred embodiments, the flow paths 30 through the test tray 20 and platen 24 are designed such that the pressure drop across the resistance members, test tray 20 and platen 24, controls the flow pattern of the heat transfer media in the vicinity of the devices 11. This allows the temperature and pressure of the inlet plenum 15 upstream of the resistance member to equilibrate, thereby providing for a controlled temperature and pressure gradient in the vicinity of the test sites 22. More than one flow resistance member can be used in the present invention to produce a desired flow pattern in the apparatus 10. For example, a second resistance member can be placed in the inlet plenum 15 to prevent the propagation of inlet flow effects from reaching the test sites 22 or the resistances can be staged to produce a more smoothly varying pressure field. It is also preferred that the resistance member and the test tray 20 be aligned in a plane perpendicular to the pressure field to minimize flow parallel to the test sites 22 and heat transfer between the test sites 22.

Figure 6:
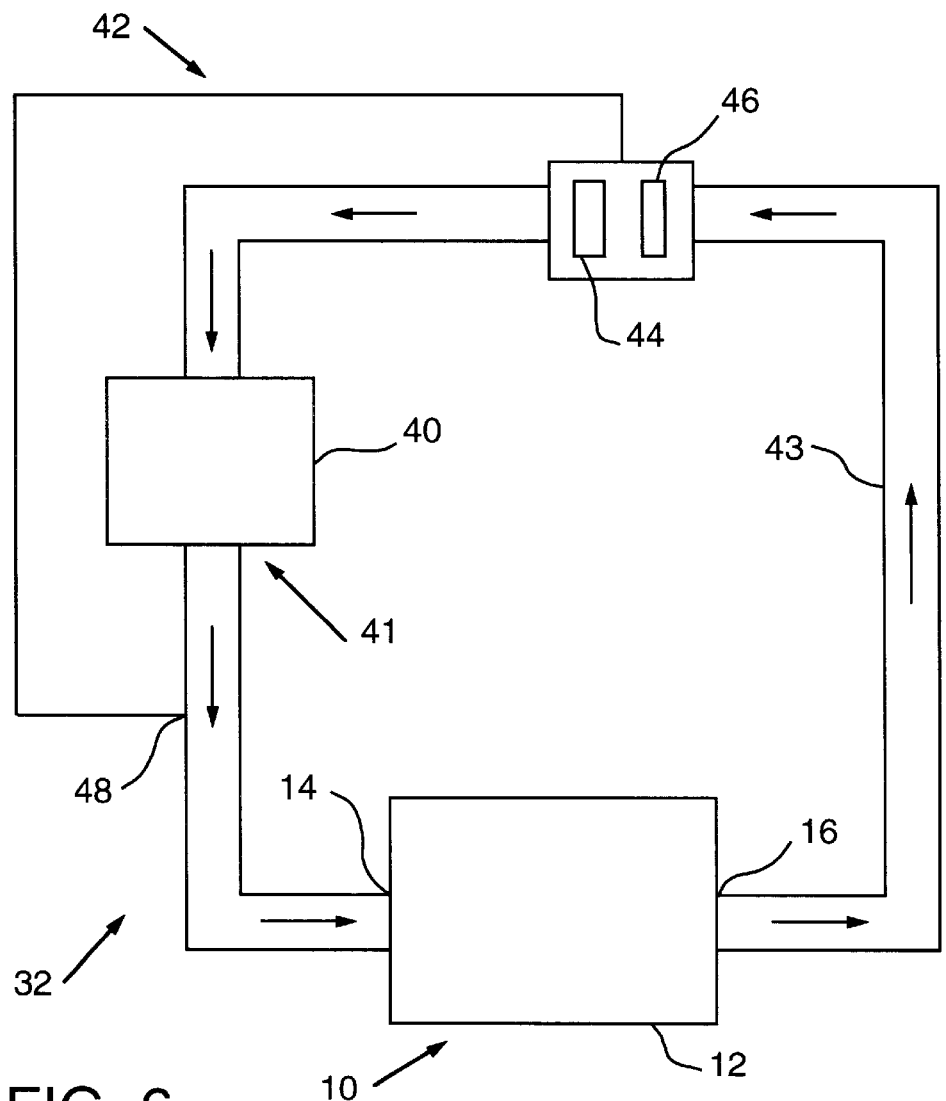
FIG. 6 is a schematic showing a preferred closed loop embodiment containing the apparatus of the present invention.
Figure 7:
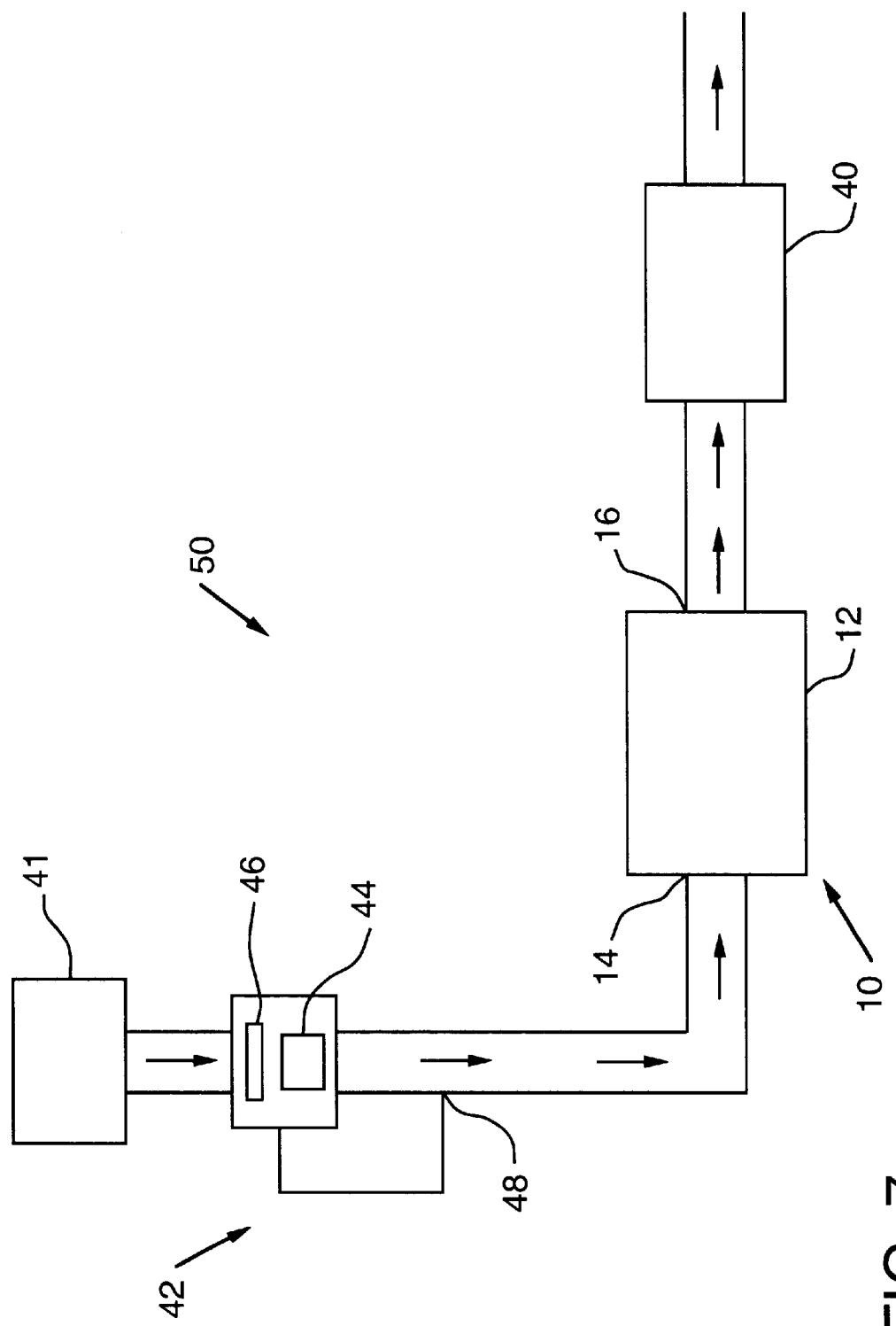
FIG. 7 is a schematic showing an alternative open loop embodiment containing the apparatus of the present invention; and, FIG. 8 is a plot showing the device temperature as a function of position on the test board.

In a preferred embodiment, the apparatus 10 is operated in a closed loop system 32, as shown in FIG. 6, in which a negative pressure source 40 and a temperature controller 42 are connected between the inlet 14 and the outlet 16 of the housing 12, such as with piping or ducts 43, as is known in the art. The negative pressure source 40 is preferably a fan positioned upstream of the inlet 14. The fan is operated to produce a high pressure region between the fan and the inlet 14 and a low pressure region between the fan and the outlet 16, thereby causing circulation of the heat transfer media contained in the closed loop, as is known in the art. In the closed loop recirculating system 32, the fan serves as a heat transfer media source 41 to the inlet of the housing 12 and a negative pressure source to the outlet of the housing 12.

The temperature controller 42 is used to control the temperature of the recirculating heat transfer media to a predetermined value by heating or cooling the recirculating heat transfer media to maintain a predetermined temperature. In a preferred embodiment, the temperature controller 42 includes a resistance heater 44 and a liquid nitrogen source 46 positioned between the outlet 16 of the housing 12 and the negative pressure source 40 for heating and cooling, respectively. The operation of the heater 44 and the cooler 46 is controlled based on the temperature of the heat transfer media measured using a temperature detector 48, such as a thermocouple, positioned in the system. The temperature detector 48 is preferably positioned between the negative pressure source 40 and the inlet 14 of the housing 12 to allow for sufficient mixing of the recirculating heat transfer media to provide feedback control of the temperature controller 42.

Alternatively, the apparatus 10 can be operated in an open system 50 in which the negative pressure source 40 can be a conventional exhaust system connected to the outlet 16 and the heat transfer media is introduced from the heat transfer media source 41, which can be a contained source or a merely a vent to the surrounding environment depending upon the heat transfer media to be used for the testing. A benefit of the open system 50 is that the heat generated by the devices 11 under test will be dissipated external to the apparatus 10. Therefore, the amount of heating or cooling that must be supplied by the temperature controller 42 will not be a function of heat transferred to the recirculating heat transfer media by the devices under test, but only of the external environment, which will generally impart additional stability to the apparatus 10.

In practice, the amount of heat transferred between the devices under test and the surrounding environment is a function of the temperature differential and the heat transfer coefficient between the devices and the environment. The heat transfer coefficient is itself a function of the thermal and physical properties of the heat transfer medium, the flow field and the temperature difference. The strength of dependence of the heat transfer coefficient on the temperature difference varies with the flow field and heat transfer conditions. Thus, it is not desirable to control either the quantity of heat transferred or the heat transfer coefficient, because to control either would require controlling the temperature of the devices to some extent, thereby biasing the data. However, if the conditions external to the actual performance of device, namely the temperature of the heat transfer medium, the flow field characteristics, and the power supply are made to be uniform for all test sites 22, the potential exists for each site 22 to have the same heat transfer coefficient and transfer the same amount of heat if the individual devices 11 perform in the same manner. In other words, if the temperature of the heat transfer medium, the flow field, and the power supply to each site are uniform, then each site 22 can be said to have the same heat transfer capability or potential, and any differences observed in the temperature and performance of the devices can therefore, be attributed to actual performance variations of the devices 11 themselves.

In the operation of the present invention, the flow paths 30 are sized to provide each test site 22 with the same heat transfer capability. The devices 11 are placed in the test sites 22 and the test tray 20 is placed in the platen 24 located within the housing 12. The housing 12 is then sealed using the load board 26, thereby bringing the test sockets 28 into electrical contact with devices 11 in the test tray 20. The temperature controller 42 is set to control the temperature of the heat transfer media contained in the closed loop system to a predetermined value and a negative pressure is applied to the outlet 16 of the housing 12 using the negative pressure source (fan) 40 which, in turn, acts as the source of the heat transfer media to the inlet 14. After the predetermined temperature has been achieved for the recirculating heat transfer media, testing is commenced by supplying power and input/output signals from the external test system to the load board 26.

Figure 8:
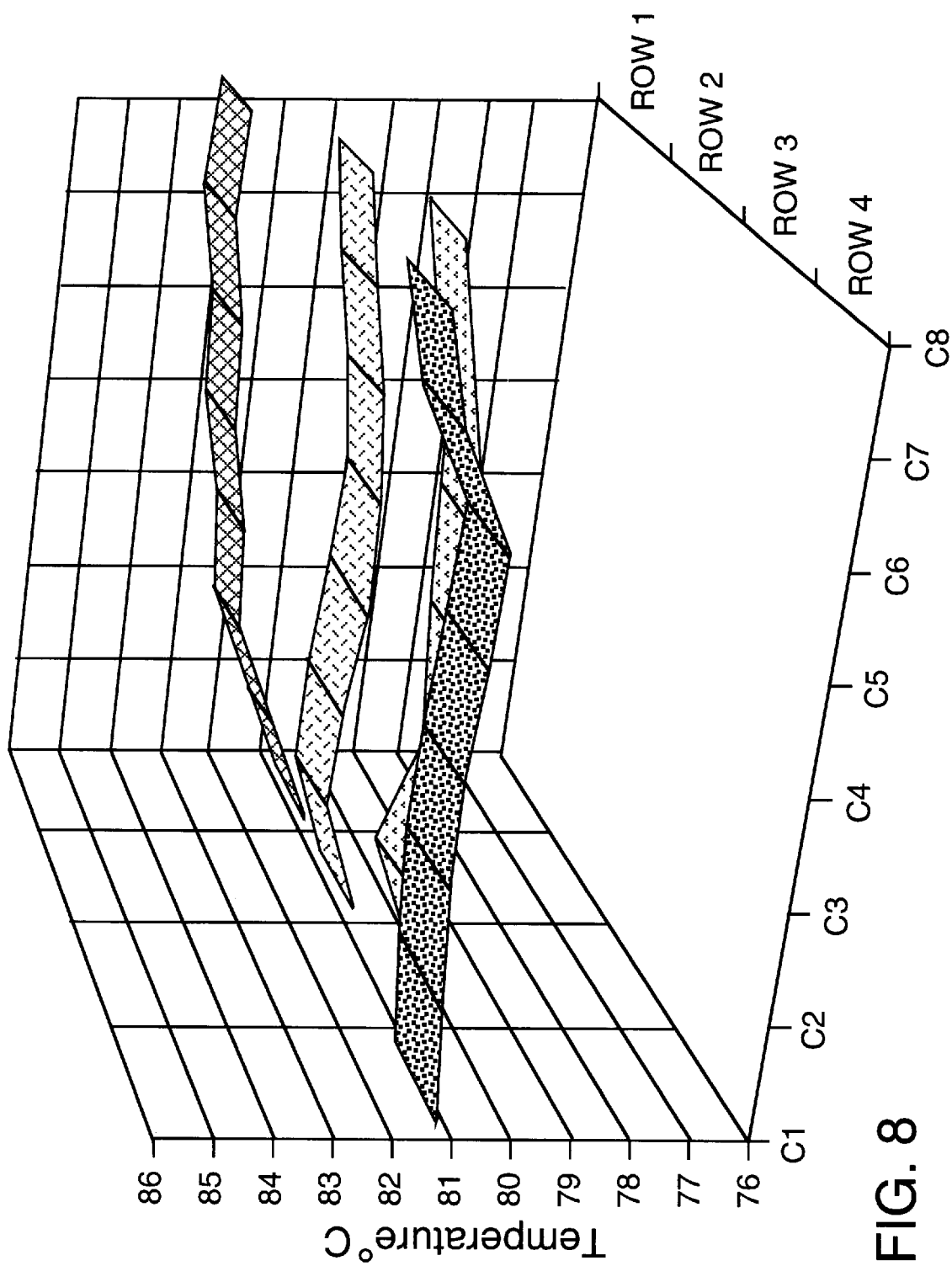

Testing was performed on 32 devices using the preferred embodiment with a 0.5 Watt test system connected to the load board 26 and air controlled at a temperature of approximately 85° C. as the heat transfer media. A negative pressure of approximately −20 inches of water was applied using the fan to recirculate the air. The flow resistance through the test tray 20 and platen 24 was designed to provide a pressure drop of at least 10 inches of water and a flow of at least 0.2 cubic feet per minute, which has been found to provide substantially uniform conditions in the vicinity of the test sites 22. The temperatures of the individual devices are shown in FIG. 8 as a function of location in the test board 20. As can be seen, the temperatures of the devices were controlled to ±1.7° C., which is well within the range of acceptable values for performance testing, as discussed above.

Those of ordinary skill in the art will appreciate that the present invention provides significant advantages over the prior art. In particular, the subject invention provides for a bulk quantity performance test device that provides substantially uniform local conditions near each of the test sites to enable more reproducible and reliable data to be generated during performance testing. In this manner, the subject invention provides for decreased testing costs, improved quality by allowing defective integrated circuit devices to be more readily identified, and higher yields by reducing the frequency of good devices being discarded based on erroneous test results. In addition, the apparatus greatly reduces the extent of technical oversight required and qualification necessary to maintain the apparatus resulting in a less costly and more efficient test procedure. While the subject invention provides these and other advantages over the prior art, it will be understood, however, that various changes in the details, materials and arrangements of parts and steps which have been herein described and illustrated in order to explain the nature of the invention may be made by those skilled in the art within the principle and scope of the invention as expressed in the appended claims.

What is claimed is:

1. An apparatus for testing integrated circuit devices, comprising:
    a housing having an inlet and an outlet;
    a test assembly disposed within said housing between said inlet and outlet, said test assembly having a plurality of device test sites for testing devices and said test sites including at least one flow path through said assembly;
    a heat transfer medium source connected to said inlet;
    a negative pressure source connected to said outlet to promote flow of the heat transfer medium from said inlet to said outlet; and,
    at least one flow resistance member positioned to control the flow of the heat transfer medium proximate to said test sites.

2. The apparatus of claim 1, wherein said resistance member is integral with said test assembly and said at least one flow path controls the flow of heat transfer medium proximate to said test sites.

3. The apparatus of claim 2, wherein said test assembly comprises:
    a load board for supplying power and input/output signals to the devices;
    a plurality of test sockets connected to said load board and corresponding to said test sites and positioned to transfer power and input/output signals to the devices;
    a platen disposed within said housing; and,
    a test tray containing the test sites seated on said platen, said test tray and said platen containing said at least one flow path through said test sites defining said resistance member.

4. The apparatus of claim 3, wherein:
    said outlet of said housing is connected to said heat transfer medium source to define a closed loop recirculating system containing said heat transfer media; and,
    said negative pressure source further comprises a high pressure region and a low pressure region, said high pressure region being connected to said inlet of said housing and said low pressure region being connected to said outlet of said housing.

5. The apparatus of claim 4, further comprising a temperature controller positioned in said low pressure region connected to a temperature detector in said high pressure region to control the temperature of the heat transfer media to a predetermined value at said temperature detector.

6. The apparatus of claim 2, wherein said at least one flow path provides a uniform resistance across said test assembly.

7. The apparatus of claim 2, wherein said at least one flow path provides a uniform pressure drop across said test assembly.

8. The apparatus of claim 1, wherein said at least one flow resistance member is positioned between said test sites and said outlet.

9. The apparatus of claim 1, wherein said at least one resistance member is configured and said outlet is positioned to provide a pressure differential perpendicular to a plane containing said test sites when a negative pressure is applied to said outlet using said negative pressure source.

10. The apparatus of claim 1, wherein said at least one resistance member is configured to provide a sufficiently high resistance to produce a substantial uniform pressure field between said resistance member and said inlet when a negative pressure is applied to said outlet using said negative pressure source.

11. The apparatus of claim 1, wherein said at least one resistance member provides for constant resistance across said resistance member.

12. A method of controlling the temperature near integrated circuit devices during performance testing, said method comprising:
    providing a test assembly having a plurality of test sites for testing devices, the test sites including at least one flow path through said assembly;
    placing the devices to be performance tested in the test sites;
    performing a performance test on the devices in the test sites; and,
    flowing a heat transfer medium having substantially uniform heat transfer capability over the devices and through the at least one flow path during the performance test.

13. The method of claim 12, wherein said flowing comprises:
    supplying a source of the heat transfer medium;
    positioning a flow resistance member adjacent to the devices opposite the heat transfer medium source; and, applying a negative pressure to the resistance member opposite to the devices and the heat transfer medium source to flow the heat transfer medium over the devices and to maintain a uniform pressure gradient near the devices.

14. The method of claim 13, wherein said providing further comprises providing a uniform resistance member integral to the test assembly.

15. The method of claim 12, wherein said flowing comprises:

positioning a flow resistance member adjacent to the devices; and, applying a negative pressure to the resistance member opposite to the devices to flow the heat transfer medium over the devices and to maintain a uniform pressure surrounding the devices.

16. The method of claim 12, wherein:

said providing further comprises providing a test assembly including a resistance member integral to the test assembly; and, said applying comprises applying a negative pressure to the test assembly opposite to the devices to flow the heat transfer medium over the devices and to maintain a uniform pressure surrounding the devices.

17. An apparatus for controlling the temperature of a plurality of integrated circuit devices contained in a corresponding number of test sites in a performance test apparatus, comprising:

a heat transfer medium source connected to the test apparatus;

a negative pressure source connected to the test apparatus to promote flow of the heat transfer medium through the test apparatus; and, at least one flow resistance member positioned within the test apparatus to control the flow of the heat transfer medium proximate to the test sites and wherein said test sites include at least one flow path through said test apparatus.

18. The apparatus of claim 17, wherein said at least one resistance member is configured and said outlet is positioned to provide a pressure differential perpendicular to a plane containing said test sites when a negative pressure is applied to said outlet using said negative pressure source.

19. The apparatus of claim 17, wherein said at least one resistance member provides a sufficiently high resistance to produce a substantial uniform pressure field between said resistance member and said inlet when a negative pressure is applied via said outlet using said negative pressure source.

20. The apparatus of claim 17, wherein said at least one resistance member represents substantially the entire resistance through the test apparatus.

21. The apparatus of claim 17, wherein said at least one resistance member is integral with the test sites and controls the flow of a heat transfer medium proximate to the test sites.

* * * * *